(12) United States Patent
Gao et al.

(10) Patent No.: US 10,529,831 B1
(45) Date of Patent: Jan. 7, 2020

(54) METHODS, APPARATUS, AND SYSTEM FOR FORMING EPITAXIAL FORMATIONS WITH REDUCED RISK OF MERGING

(71) Applicant: GLOBALFOUNDRIES INC., Grand Cayman (KY)

(72) Inventors: Qun Gao, Clifton Park, NY (US); Matthew W. Stoker, Ballston Lake, NY (US); Haigou Huang, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/054,881

(22) Filed: Aug. 3, 2018

(51) Int. Cl.
*H01L 29/78* (2006.01)
*H01L 29/66* (2006.01)

(52) U.S. Cl.
CPC .... *H01L 29/66795* (2013.01); *H01L 29/7853* (2013.01)

(58) Field of Classification Search
CPC .................................................. H01L 29/0847
See application file for complete search history.

(56) References Cited

U.S. PATENT DOCUMENTS

| | | | |
|---|---|---|---|
| 6,716,690 B1 | 4/2004 | Wang et al. | |
| 7,250,645 B1 | 7/2007 | Wang et al. | |
| 7,564,105 B2 | 7/2009 | Chi et al. | |
| 7,923,337 B2 | 4/2011 | Chang et al. | |
| 8,569,152 B1 | 10/2013 | Basker et al. | |
| 8,609,518 B2 | 12/2013 | Wann et al. | |
| 8,796,759 B2 | 8/2014 | Pemg et al. | |
| 10,158,003 B2 * | 12/2018 | Cheng | H01L 29/41791 |
| 2011/0210393 A1 * | 9/2011 | Chen | H01L 21/82343 257/347 |
| 2013/0026539 A1 | 1/2013 | Tang et al. | |
| 2015/0171085 A1 * | 6/2015 | Fumitake | H01L 27/0924 257/369 |
| 2016/0268171 A1 * | 9/2016 | Wei | H01L 21/82380 |
| 2019/0252240 A1 * | 8/2019 | Lee | H01L 21/764 |

* cited by examiner

*Primary Examiner* — Thao P Le
(74) *Attorney, Agent, or Firm* — Williams Morgan, P.C.

(57) ABSTRACT

At least one method, apparatus and system providing semiconductor devices comprising a semiconductor substrate; a first fin and a second fin on the semiconductor substrate; a first epitaxial formation on the first fin and having an inner surface oriented toward the second fin and an outer surface oriented away from the second fin; a second epitaxial formation on the second fin and having an inner surface oriented toward the first fin and an outer surface oriented away from the first fin; and a conformal dielectric layer on at least portions of the inner and outer surfaces of the first epitaxial formation, on at least portions of the inner and outer surfaces of the first epitaxial formation and the second epitaxial formation, and merged between the inner surface of the first epitaxial formation and inner surface of the second epitaxial formation.

12 Claims, 5 Drawing Sheets

METHODS, APPARATUS, AND SYSTEM FOR FORMING EPITAXIAL FORMATIONS WITH REDUCED RISK OF MERGING

BACKGROUND OF THE INVENTION

Field of the Invention

Generally, the present disclosure relates to the manufacture of sophisticated semiconductor devices, and more specifically, to semiconductor devices having epitaxial formations with reduced risk of undesired merging.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

In the continuing effort to increase transistor density in semiconductor devices, designers have attempted to reduce the distances between fins. However, reducing the distance between fins increases the risk that contacts formed over and to adjacent fins may merge, i.e., may form undesirable short-circuits. Also, contacts formed symmetrically above fins may provide relatively poor surfaces for interfacing with overlying conductive structures.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and systems for forming asymmetrical and unmerged epitaxial formations.

In one embodiment, the present disclosure relates to a method comprising forming a first fin and a second fin on a semiconductor substrate; forming, on the first fin, a first epitaxial formation having an inner surface oriented toward the second fin and an outer surface oriented away from the second fin; forming, on the second fin, a second epitaxial formation and having an inner surface oriented toward the first fin and an outer surface oriented away from the first fin; depositing a conformal dielectric material at least on the first epitaxial formation, the second epitaxial formation, an inner surface of the upper region of the first fin oriented toward the second fin, an outer surface of the upper region of the first fin oriented away from the second fin, an inner surface of the upper region of the second fin oriented toward the first fin, and an outer surface of the upper region of the second fin oriented away from the first fin, wherein the conformal dielectric material merges between the inner surface of the first epitaxial formation and inner surface of the second epitaxial formation; and etching the conformal dielectric material to form a conformal dielectric layer on at least portions of the inner and outer surfaces of the first epitaxial formation and the second epitaxial formation, and merged between the inner surface of the first epitaxial formation and inner surface of the second epitaxial formation.

In one embodiment, the present disclosure relates to a semiconductor device, comprising a semiconductor substrate; a first fin and a second fin on the semiconductor substrate; a first epitaxial formation on the first fin and having an inner surface oriented toward the second fin and an outer surface oriented away from the second fin; a second epitaxial formation on the second fin and having an inner surface oriented toward the first fin and an outer surface oriented away from the first fin; and a conformal dielectric layer on at least portions of the inner and outer surfaces of the first epitaxial formation, on at least portions of the inner and outer surfaces of the first epitaxial formation and the second epitaxial formation, and merged between the inner surface of the first epitaxial formation and inner surface of the second epitaxial formation.

In one embodiment, the present disclosure relates to a system comprising a semiconductor device processing system to manufacture a semiconductor device; and a processing controller operatively coupled to the semiconductor device processing system, the processing controller configured to control an operation of the semiconductor device processing system; wherein the semiconductor device processing system is adapted to implement a method referred to above.

BRIEF DESCRIPTION OF THE DRAWINGS

The disclosure may be understood by reference to the following description taken in conjunction with the accompanying drawings, in which like reference numerals identify like elements, and in which.

Figure 1:
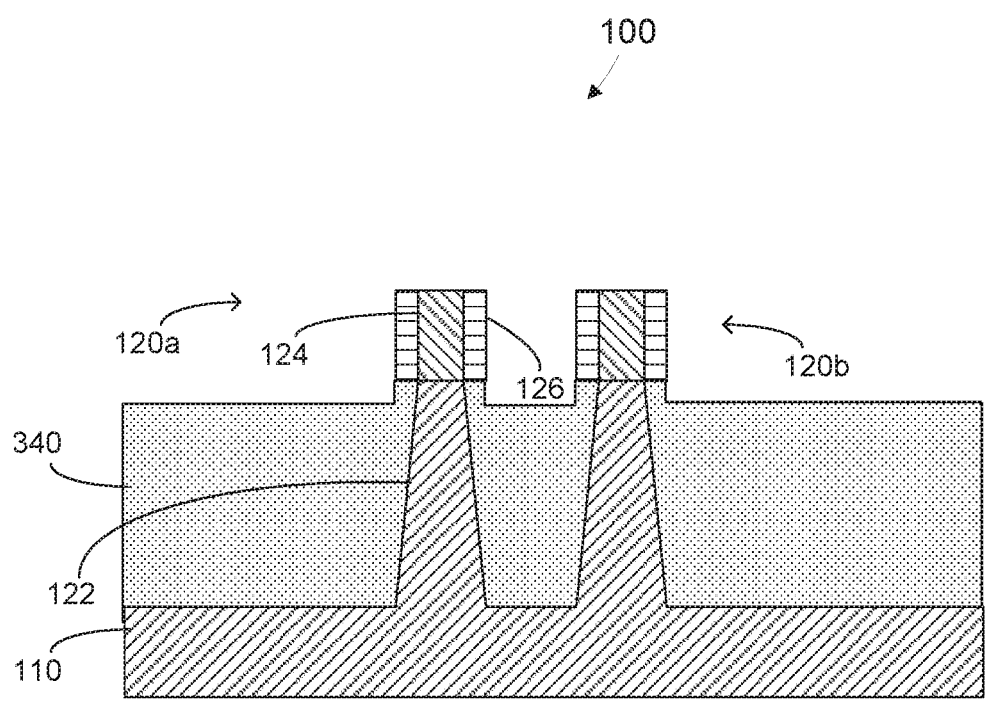
FIG. 1 illustrates a stylized, simplified cross-sectional view of a semiconductor device 100 after a first stage of manufacture, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for semiconductor devices comprising asymmetrical and unmerged epitaxial formations.

Turning now to FIG. 1, a stylized, simplified cross-sectional view of a semiconductor device 100 after a first stage of manufacture, in accordance with embodiments herein, is depicted. In the first stage of manufacture, a plurality of fins 120, e.g., fins 120a and 120b, are formed on a substrate 110. For example, the substrate 110 may comprise bulk silicon, and the fins 120a and 120b may be formed by patterning and etching bulk silicon, to yield fin body 122 from silicon. In other embodiments, not shown, the fins 120a and 120b may be formed by depositing one or more materials on a substrate.

The fins 120a and 120b may have any desired fin pitch (distance between fins). In one embodiment, the fins 120a and 120b are less than 25 nm apart.

Each fin 120a, 120b also comprises a cap 124 and a liner 126. The cap 124 and the liner 126 are formed on top of each fin body 122. In one embodiment, the liner 126 comprises silicon nitride (SiN).

An insulating region 340 may be disposed between fins 120. The insulating region 340 may comprise any suitable material known to the person of ordinary skill in the art. The insulating region 340 may comprise an oxide and may be formed by techniques known to the person of ordinary skill in the art. Desirably, after the insulating region 340 is formed, an upper portion of each fin 120a and 120b are above the insulating region 340. As depicted, the upper portion of each fin 120a and 120b may comprise the cap 124, the liner 126, and a portion of the fin body 122.

Figure 2:
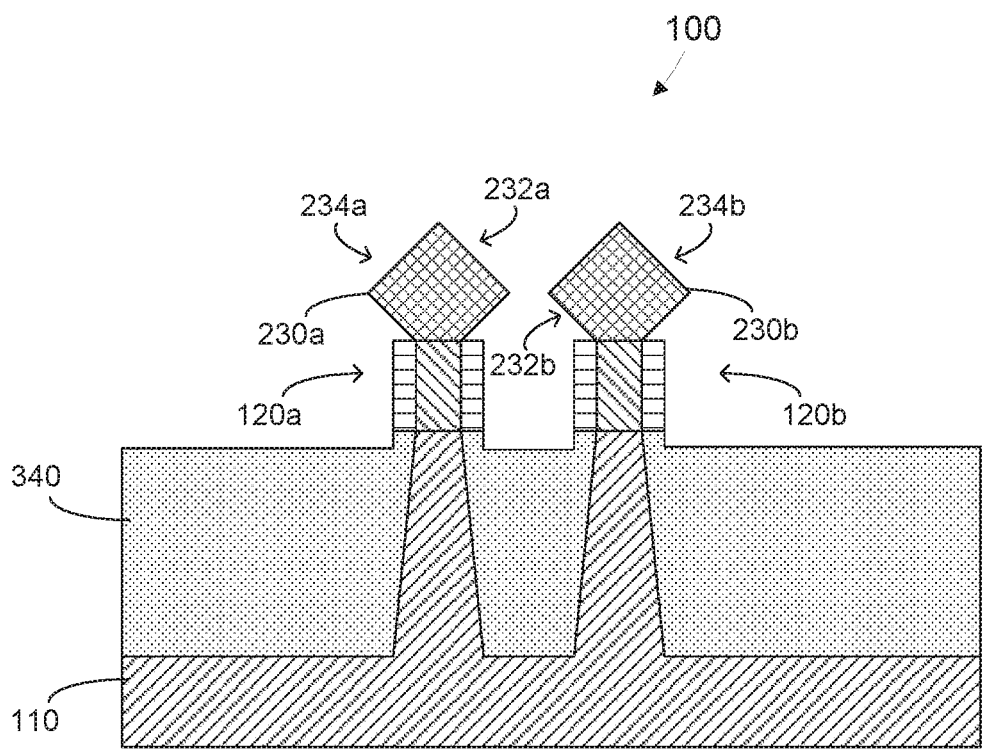
FIG. 2 illustrates a stylized, simplified cross-sectional view of a semiconductor device 100 after a second stage of manufacture, in accordance with embodiments herein.

FIG. 2 illustrates a stylized, simplified cross-sectional view of a semiconductor device 100 after a second stage of manufacture, in accordance with embodiments herein. In the second stage of manufacture, a first epitaxial formation 230a and a second epitaxial formation 230b are formed on top of each fin 120a, 120b, respectively. The first epitaxial formation 230a and the second epitaxial formation 230b may comprise epitaxial silicon, doped epitaxial silicon, epitaxial silicon-germanium, or doped epitaxial silicon-germanium, among other materials. Techniques for forming the first and second epitaxial formations 230a and 230b are known to the person of ordinary skill in the art and need not be described in detail. The conditions under which the first and second epitaxial formations 230a and 230b are formed should be selected to prevent merging of the first and second epitaxial formations 230a and 230b between the fins 120a and 120b.

The first and second epitaxial formations 230a and 230b each comprise an inner surface oriented toward the other fin and an outer surface oriented away from the other fin. For example, the first epitaxial formation 230a on fin 120a comprises an inner surface 232a oriented toward the fin 120b and an outer surface 234a oriented away from the fin 120b. Comparably, the second epitaxial formation 230b on the fin 120b comprises an inner surface 232b oriented toward the fin 120a and an outer surface 234b oriented away from the fin 120a.

Figure 3:
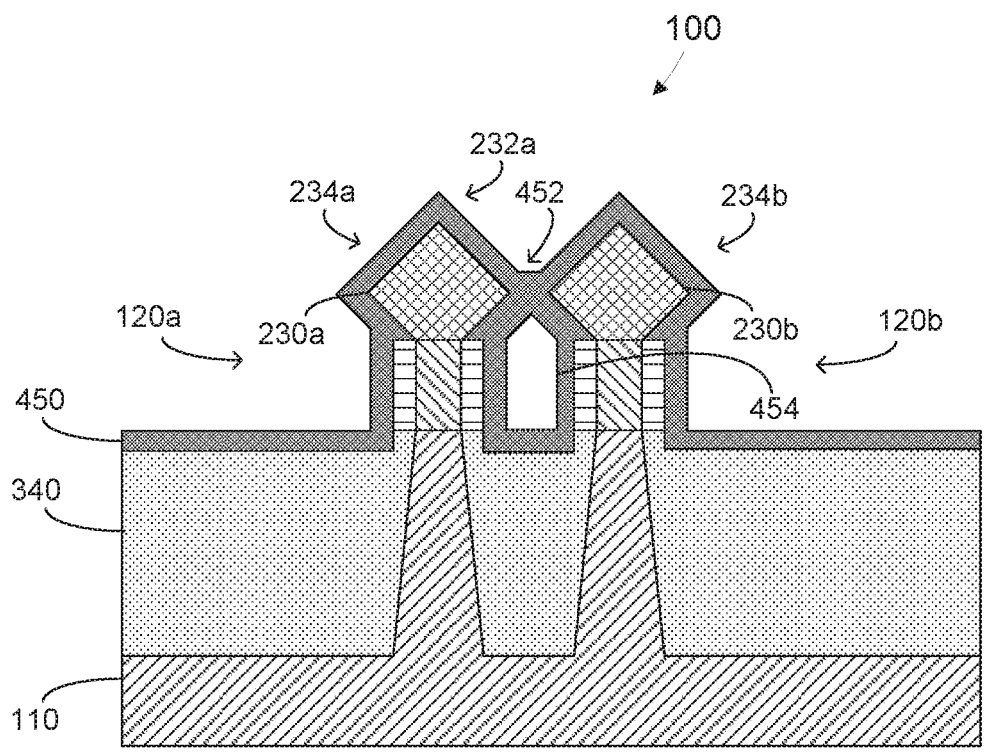
FIG. 3 illustrates a stylized, simplified cross-sectional view of a semiconductor device 100 after a third stage of manufacture, in accordance with embodiments herein.

FIG. 3 illustrates a stylized, simplified cross-sectional view of a semiconductor device 100 after a third stage of manufacture, in accordance with embodiments herein. In the third stage of manufacture, a conformal dielectric material 450 is formed on at least portions of the inner surfaces 232a and 232b and the outer surfaces 234a and 234b of the first and second epitaxial formations 230a and 230b and is merged between the inner surface 232a of the first epitaxial formation 230a and the inner surface 232b of the second epitaxial formation 230b. In a particular embodiment, as depicted in FIG. 3, the conformal dielectric material 450 is further formed on at least a portion of a surface of the insulating region 340, on an inner surface of the upper region of the fin 120a oriented toward the fin 120b, on an outer surface of the upper region of the fin 120a oriented away from the fin 120b, on an inner surface of the upper region of the fin 120b oriented toward the fin 120a, and on an outer surface of the upper region of the fin 120b oriented away from the first fin 120a. In one embodiment, the conformal dielectric material 450 is formed by atomic layer deposition (ALD). Any dielectric material that may be deposited conformally may be used in the conformal dielectric material 450. In one embodiment, the conformal dielectric material 450 may comprise a nitride or an oxide.

Forming the conformal dielectric material 450 yields a merged region 452 which pinches off a space 454 between the fins 120a and 120b.

Figure 4:
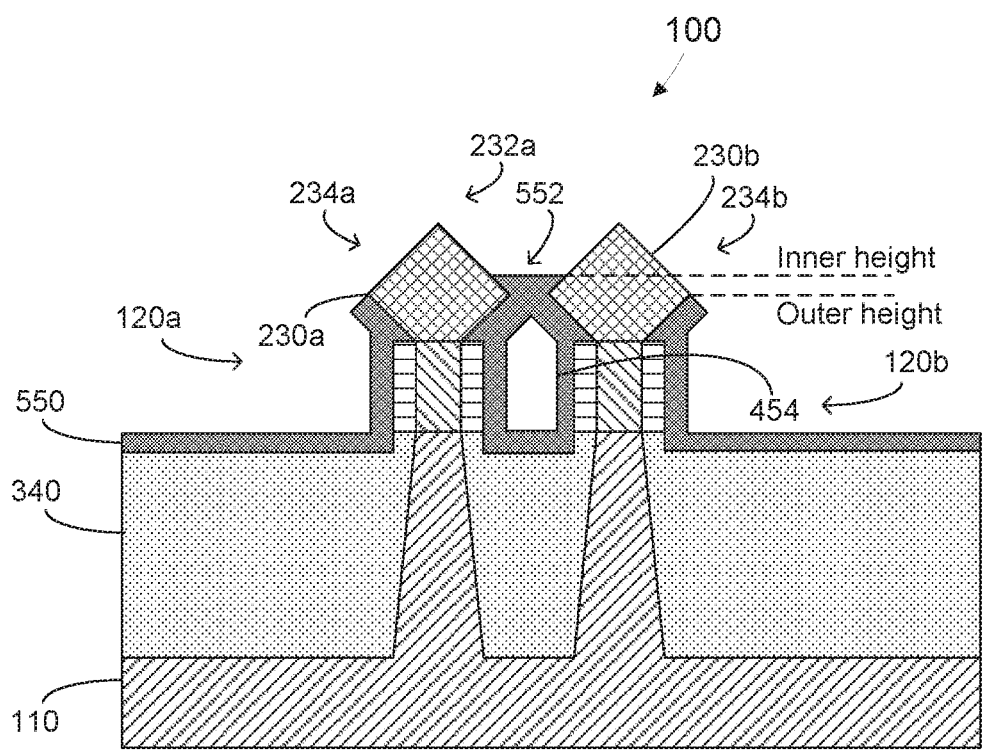
FIG. 4 illustrates a stylized, simplified cross-sectional view of a semiconductor device 100 after a fourth stage of manufacture, in accordance with embodiments herein.

FIG. 4 illustrates a stylized, simplified cross-sectional view of a semiconductor device 100 after a fourth stage of manufacture, in accordance with embodiments herein. In the fourth stage of manufacture, the conformal dielectric material 450 is etched to yield a conformal dielectric layer 550. The etch conditions are selected such that the conformal dielectric material 450 undergoes greater etching on the outer surfaces 234a and 234b of the first and second epitaxial formations 230a and 230b than it undergoes on the inner surfaces 232a and 232b of the first and second epitaxial formations 230a and 230b. In other words, the conformal dielectric layer 550 has an inner height above the top of the substrate between 110 the first and second epitaxial formations 230a and 230b that is greater than the outer height above the top of the substrate 110 and to the non-facing sides of the first and second epitaxial formations 230a and 230b. The etch conditions are also selected such that the conformal dielectric layer 550 possesses a merged region 552.

Figure 5:
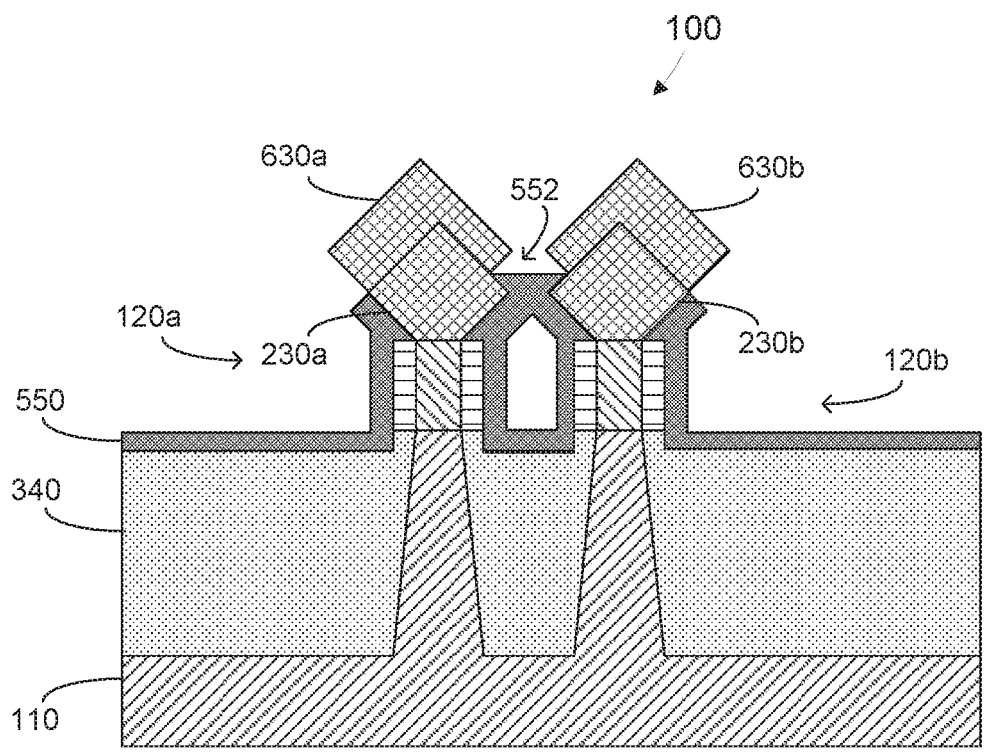
FIG. 5 illustrates a stylized, simplified cross-sectional view of a semiconductor device 100 after a fifth stage of manufacture, in accordance with embodiments herein.

FIG. 5 illustrates a stylized, simplified cross-sectional view of a semiconductor device 100 after a fifth stage of manufacture, in accordance with embodiments herein. In the fifth stage of manufacture, an epitaxial growth process is performed to form a third epitaxial formation 630a on the first epitaxial formation 230a; and a fourth epitaxial formation 630b on the second epitaxial formation 230b. The epitaxial growth process forms epitaxial material substantially from the first and second epitaxial formations 230a and 230b and substantially does not form epitaxial material on the conformal dielectric layer 550.

Because the inner height of the conformal dielectric layer 550 at the merged region 552 is greater than the outer height of the conformal dielectric layer 550, the epitaxial growth process forms the third and fourth epitaxial formations 630a and 630b asymmetrically. A preponderance of the epitaxial growth of each of the third and fourth epitaxial formations 630a and 630b is away from the other of the third and fourth epitaxial formations 630a and 630b. Though not to be bound by theory, this aspect of the epitaxial growth of the third and fourth epitaxial formations 630a and 630b may reduce the likelihood of undesired merging of the third and fourth epitaxial formations 630a and 630b.

Thereafter, one or more additional processes (not shown) may be performed to produce a final product comprising the structure of FIG. 5.

Figure 6:
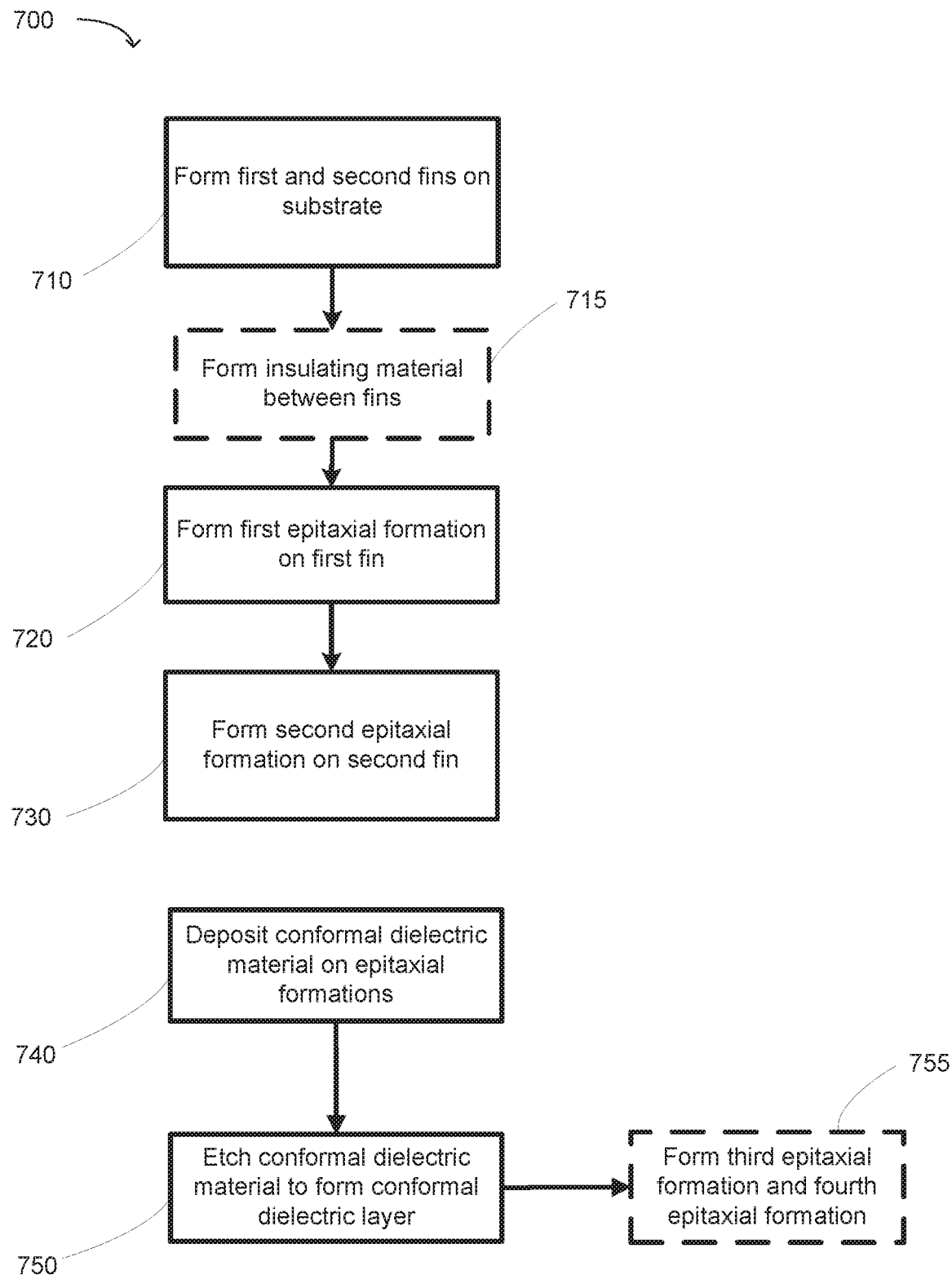
FIG. 6 illustrates a flowchart depiction of a method for manufacturing a device, in accordance with embodiments herein.

FIG. 6 illustrates a flowchart depiction of a method 700 for manufacturing a device, in accordance with embodiments herein. The method 700 comprises forming (at 710) a first fin and a second fin on a semiconductor substrate. In one embodiment, the first fin and the second fin may be less than 25 nm apart.

In one embodiment, the method 700 may further comprise forming (at 714) an insulating region around and between the first fin and the second fin, wherein an upper portion of the first fin and an upper portion of the second fin are above the insulating region.

The method 700 also comprises forming (at 720), on the first fin, a first epitaxial formation having an inner surface oriented toward the second fin and an outer surface oriented away from the second fin; and forming (at 730), on the second fin, a second epitaxial formation and having an inner surface oriented toward the first fin and an outer surface oriented away from the first fin.

The method 700 additionally comprises depositing (at 740) a conformal dielectric material at least on the first epitaxial formation, the second epitaxial formation, an inner surface of the upper region of the first fin oriented toward the second fin, an outer surface of the upper region of the first fin oriented away from the second fin, an inner surface of the upper region of the second fin oriented toward the first fin, and an outer surface of the upper region of the second fin oriented away from the first fin, wherein the conformal dielectric material merges between the inner surface of the first epitaxial formation and inner surface of the second epitaxial formation. In embodiments wherein the method 700 comprises forming (at 714) the insulating material between the fins, the forming (at 714) may be performed prior to depositing the conformal dielectric material, and the conformal dielectric material may be deposited (at 740) on the insulating material.

In one embodiment, the conformal dielectric material comprises a material selected from nitrides and oxides. Alternatively or in addition, depositing (at 740) the conformal dielectric material may comprise atomic layer deposition (ALD).

The method 700 further comprises etching (at 750) the conformal dielectric material to form a conformal dielectric layer on at least portions of the inner and outer surfaces of the first epitaxial formation and the second epitaxial formation, and merged between the inner surface of the first epitaxial formation and inner surface of the second epitaxial formation.

In one embodiment, etching (at 750) is performed under conditions such that a top of the merged conformal dielectric layer between the inner surfaces of the first and second epitaxial formations is higher than a top of the conformal dielectric layer on the outer surfaces of the first and second epitaxial formations.

In an additional embodiment, the method 700 may further comprises forming (at 755) a third epitaxial formation on the first epitaxial formation and a fourth epitaxial formation on the second epitaxial formation, wherein the third and fourth epitaxial formations are not formed on the conformal dielectric layer.

Figure 7:
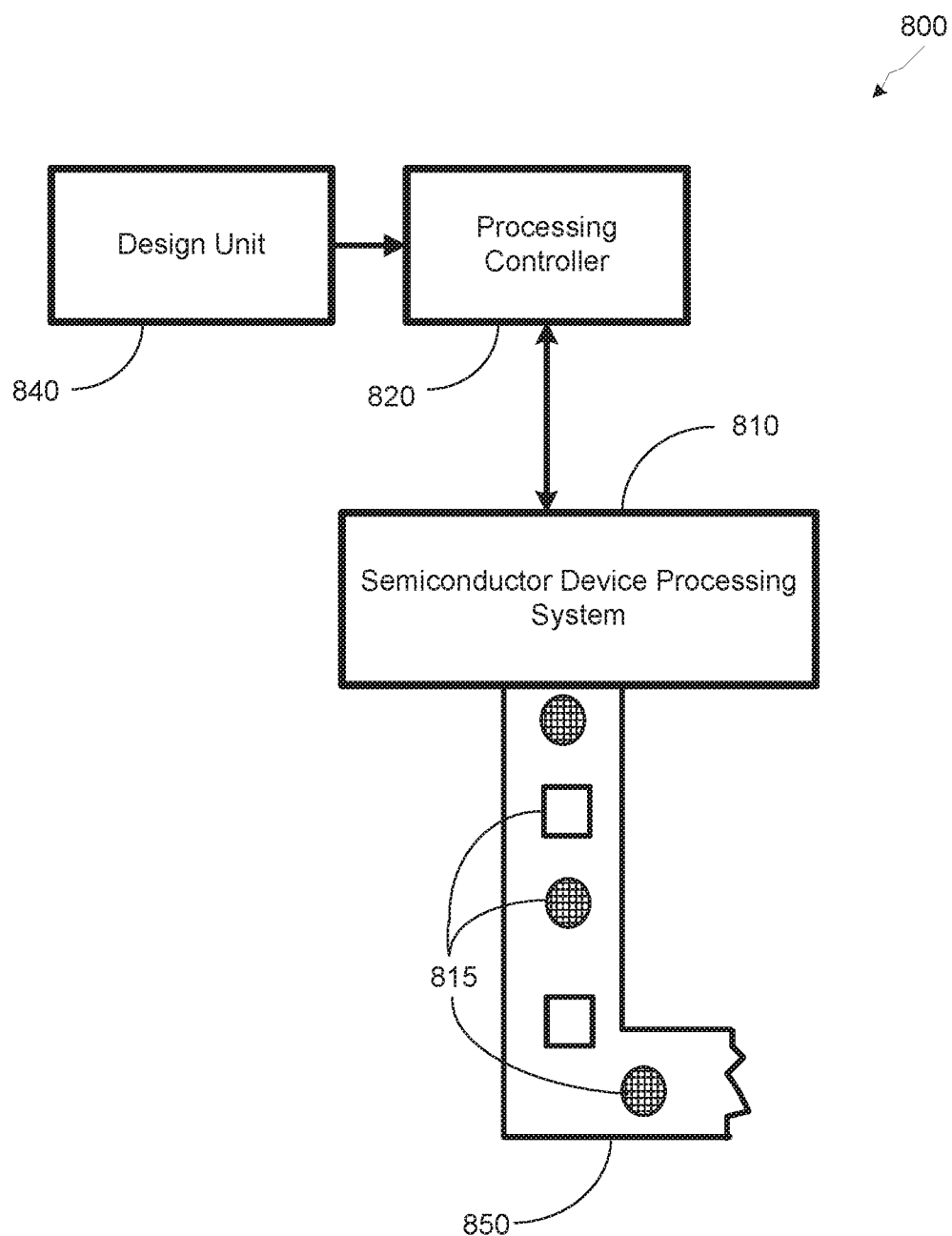
FIG. 7 illustrates a stylized depiction of a system for fabricating a semiconductor device, in accordance with embodiments herein.

Turning now to FIG. 7, a stylized depiction of a system for fabricating a semiconductor device, in accordance with embodiments herein, is illustrated. The system 800 provides for semiconductor devices comprising asymmetrical and unmerged epitaxial formations.

The system 800 of FIG. 8 may comprise a semiconductor device processing system 810, a processing controller 820, and a design unit 840.

The semiconductor device processing system 810 may comprise various processing tools, such as etch process stations, photolithography process stations, oxide deposition process stations, CMP process stations, epitaxy (EPI) process stations, etc. The semiconductor device processing system 810 may also comprise one or more metrology tools. One or more of the processing steps performed by the processing system 810 may be controlled by the processing controller 820. The processing controller 820 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc. Generally, the processing controller 820 may communicate to the semiconductor device processing system 810 via an interface.

The semiconductor device processing system 810 may produce semiconductor devices on a medium, such as silicon wafers. More particularly, the semiconductor device processing system 810 may produce semiconductor devices as described above.

The production of integrated circuits by the device processing system 810 may be based upon the circuit designs provided by the integrated circuits design unit 840. The processing system 810 may provide processed integrated circuits/devices 88 on a transport mechanism 850, such as a conveyor system. In some embodiments, the conveyor system may be sophisticated clean room transport systems that are capable of transporting semiconductor wafers.

In some embodiments, the items labeled "815" may represent individual wafers, and in other embodiments, the items 815 may represent a group of semiconductor wafers, e.g., a "lot" of semiconductor wafers. The semiconductor device 815 may comprise a transistor, a capacitor, a resistor, a memory cell, a processor, and/or the like.

The design unit 840 of the system 800 is capable of providing a circuit design that may be manufactured by the semiconductor processing system 810. The design unit 840 may be capable of determining a desired distance between fins, a desired thickness of a conformal dielectric layer on first and second epitaxial formations, and/or other parameters of a semiconductor device as shown in FIGS. 1-5 or a process as depicted in FIG. 6.

Based at least upon these specifications, the design unit 840 may provide data for manufacturing a semiconductor device in accordance with embodiments herein.

The system 800 may be capable of performing analysis and manufacturing of various products involving various technologies. For example, the system 800 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a semiconductor substrate;
a first fin and a second fin on the semiconductor substrate;
a first epitaxial formation on the first fin and having an inner surface oriented toward the second fin and an outer surface oriented away from the second fin;
a second epitaxial formation on the second fin and having an inner surface oriented toward the first fin and an outer surface oriented away from the first fin; and
a conformal dielectric layer on at least portions of the inner and outer surfaces of the first epitaxial formation, on at least portions of the inner and outer surfaces of the first epitaxial formation and the second epitaxial formation, and merged between the inner surface of the first epitaxial formation and inner surface of the second epitaxial formation, wherein a top of the merged conformal dielectric layer between the inner surfaces of the first and second epitaxial formations is higher than a top of the conformal dielectric layer on the outer surfaces of the first and second epitaxial formations.

2. The semiconductor device of claim 1, further comprising an insulating region around and between the first fin and the second fin, wherein an upper portion of the first fin and an upper portion of the second fin are above the insulating region.

3. The semiconductor device of claim 2, wherein the conformal dielectric layer is further on at least a portion of a surface of the insulating region, on an inner surface of the upper region of the first fin oriented toward the second fin, on an outer surface of the upper region of the first fin oriented away from the second fin, on an inner surface of the upper region of the second fin oriented toward the first fin, and on an outer surface of the upper region of the second fin oriented away from the first fin.

4. The semiconductor device of claim 1, further comprising:
a third epitaxial formation on the first epitaxial formation; and
a fourth epitaxial formation on the second epitaxial formation;
wherein the third and fourth epitaxial formations are not disposed on the conformal dielectric layer.

5. The semiconductor device of claim 1, wherein the conformal dielectric layer comprises a material selected from nitrides and oxides.

6. The semiconductor device of claim 1, wherein the first fin and the second fin are less than 25 nm apart.

7. A system, comprising:
a semiconductor device processing system to manufacture a semiconductor device; and
a processing controller operatively coupled to the semiconductor device processing system, the processing controller configured to control an operation of the semiconductor device processing system;
wherein the semiconductor device processing system is adapted to:
form a first fin and a second fin on the semiconductor substrate;
form, on the first fin, a first epitaxial formation having an inner surface oriented toward the second fin and an outer surface oriented away from the second fin;
form, on the second fin, a second epitaxial formation and having an inner surface oriented toward the first fin and an outer surface oriented away from the first fin;
deposit a conformal dielectric material at least on the first epitaxial formation, the second epitaxial formation, an inner surface of the upper region of the first fin oriented toward the second fin, an outer surface of the upper region of the first fin oriented away from the second fin, an inner surface of the upper region of the second fin oriented toward the first fin, and an outer surface of the upper region of the second fin oriented away from the first fin, wherein the conformal dielectric material merges between the inner surface of the first epitaxial formation and inner surface of the second epitaxial formation and pinches off a space between the first fin and the second fin; and
etch the conformal dielectric material to form a conformal dielectric layer on at least portions of the inner and outer surfaces of the first epitaxial formation and the second epitaxial formation, and merged between the inner surface of the first epitaxial formation and inner surface of the second epitaxial formation.

8. The system of claim 7, wherein the semiconductor device processing system is further adapted to:
form an insulating region around and between the first fin and the second fin prior to depositing the conformal dielectric material, wherein an upper portion of the first fin and an upper portion of the second fin are above the insulating region.

9. The system of claim 7, wherein the semiconductor device processing system is adapted to etch the conformal dielectric material such that a top of the merged conformal dielectric layer between the inner surfaces of the first and second epitaxial formations is higher than a top of the conformal dielectric layer on the outer surfaces of the first and second epitaxial formations.

10. The system of claim 7, wherein the semiconductor device processing system is further adapted to:
form a third epitaxial formation on the first epitaxial formation; and
form a fourth epitaxial formation on the second epitaxial formation;
wherein the third and fourth epitaxial formations are not formed on the conformal dielectric layer.

11. The system of claim 7, wherein the semiconductor device processing system is adapted to deposit a material selected from nitrides and oxides as the conformal dielectric material.

12. The system of claim 7, wherein the semiconductor device processing system is adapted to deposit the conformal dielectric material by atomic layer deposition (ALD).

* * * * *